(12) United States Patent
Wilson et al.

(10) Patent No.: US 11,837,521 B2
(45) Date of Patent: Dec. 5, 2023

(54) WIRE BONDED AIR HEAT SINK

(71) Applicant: Raytheon Company, Waltham, MA (US)

(72) Inventors: James S. Wilson, Hurst, TX (US); Alyson M. Tuttle, Plano, TX (US); Karl L. Worthen, Dallas, TX (US)

(73) Assignee: RAYTHEON COMPANY, Waltham, MA (US)

( * ) Notice: Subject to any disclaimer, the term of this patent is extended or adjusted under 35 U.S.C. 154(b) by 88 days.

(21) Appl. No.: 17/233,824

(22) Filed: Apr. 19, 2021

(65) Prior Publication Data
US 2022/0336319 A1    Oct. 20, 2022

(51) Int. Cl.
*H01L 23/367* (2006.01)
*H01L 23/373* (2006.01)
*H01L 23/473* (2006.01)

(52) U.S. Cl.
CPC ...... *H01L 23/3677* (2013.01); *H01L 23/3736* (2013.01); *H01L 23/473* (2013.01); *H01L 2924/0002* (2013.01)

(58) Field of Classification Search
CPC ............ H01L 23/3677; H01L 23/3736; H01L 23/3672; H01L 21/4882; H01L 23/473; H01L 2924/0002
See application file for complete search history.

(56) References Cited

U.S. PATENT DOCUMENTS

| 2007/0289729 | A1* | 12/2007 | Campbell | ........... H01L 23/3677 257/E23.105 |
| 2008/0053648 | A1* | 3/2008 | Furman | ................. H01L 23/473 257/E23.098 |
| 2011/0180925 | A1* | 7/2011 | Chandrasekaran | ..... H01L 21/50 257/713 |

FOREIGN PATENT DOCUMENTS

JP    2570645 B2    1/1997

* cited by examiner

*Primary Examiner* — Patricia D Valenzuela
(74) *Attorney, Agent, or Firm* — CANTOR COLBURN LLP

(57) ABSTRACT

An electronic device includes a semiconductor substrate and a heat sink arranged on a surface of the semiconductor substrate. The heat sink includes a plurality of metal filaments that each includes a first end joined to the surface, a second end, and a body over the surface such that the body is surrounded by a coolant medium to dissipate heat. The heat sink is not part of an electrical network.

6 Claims, 5 Drawing Sheets

US 11,837,521 B2

WIRE BONDED AIR HEAT SINK

BACKGROUND

The present disclosure generally relates to heat sinks, and more specifically to wire bonded air heat sinks.

Heat sinks are passive heat exchangers that transfer heat generated by an electronic or a mechanical device to a fluid medium, such as air or liquid coolant, where it is dissipated away from the device, thereby allowing regulation of the device's temperature. Heat sinks are designed to maximize surface area in contact with the cooling medium surrounding it, such as the air. Air velocity, choice of material, protrusion design and surface treatment are factors that affect the performance of a heat sink. Heat sink attachment methods and thermal interface materials also affect the substrate temperature.

SUMMARY

According to embodiments, an electronic device includes a semiconductor substrate and a heat sink arranged on a surface of the semiconductor substrate. The heat sink includes a plurality of metal filaments that each includes a first end joined to the surface, a second end, and a body over the surface such that the body is surrounded by a coolant medium to dissipate heat. The heat sink is not part of an electrical network.

According to other embodiments, an electronic device includes a semiconductor substrate and a heat sink connected directly to a surface of the semiconductor substrate. The heat sink includes a metal filament that includes a first end joined to the surface and a second end joined to the surface. The heat sink is not part of an electrical network.

Yet, according to other embodiments, a method of making a heat sink on an electronic device includes heating a metal filament and joining a first end of the metal filament to a surface of a semiconductor substrate. The method further includes extending the metal filament from the surface of the semiconductor substrate. The method includes repeating the heating, joining, and extending to form a plurality of metal filaments that dissipate heat from the semiconductor substrate. The heat sink is not part of an electrical network.

Additional features and advantages are realized through the techniques of the present disclosure. Other embodiments and aspects of the disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1A:
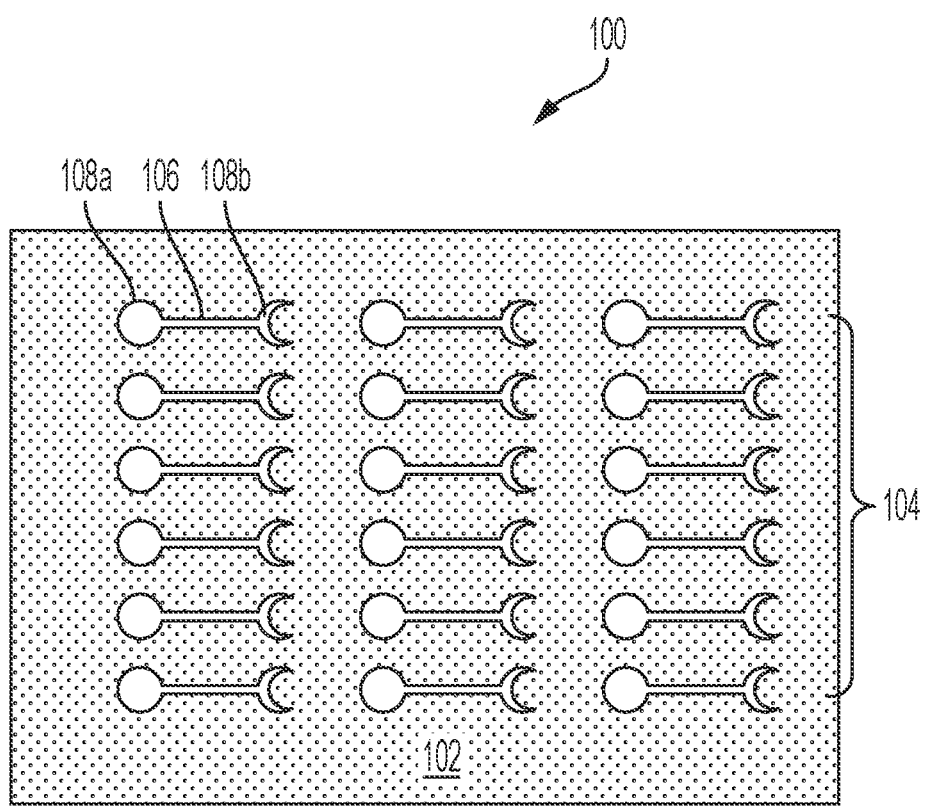
FIG. 1A is a top view of a heat sink with connected loops formed by ball bonding on an electronic device with according to embodiments of the present disclosure.

For the sake of brevity, conventional techniques related to semiconductors may or may not be described in detail herein. Moreover, the various tasks and process steps described herein can be incorporated into a more comprehensive procedure or process having additional steps or functionality not described in detail herein. In particular, various steps in the manufacture of semiconductors and metal bonding processes are known and so, in the interest of brevity, many conventional steps will only be mentioned briefly herein or will be omitted entirely without providing the well-known process details.

Turning now to an overview of technologies that are more specifically relevant to aspects of the disclosure, flip chips interconnect semiconductor devices, such as integrated circuits (IC) chips, e.g., monolithic microwave integrated circuits (MMIC) and microelectromechanical systems (MEMS), to external circuitry. For example, solder bumps are deposited on the top side of chip pads of the wafer during the final wafer processing step. In order to mount the chip to external circuitry (e.g., a circuit board or another chip or wafer), the chip is flipped over so that its top side faces down, and aligned so that its pads align with matching pads on the external circuit. Then the solder is reflowed to complete the interconnect.

Various methods are used to cool flip chip mounted devices. For example, individual heat sinks are bonded to the flip chips. These heat sinks require using a separate thermal interface material to minimize the thermal resistance between the heatsink and the semiconductor. The thermal resistance from the interface material results from both the inherent thermal properties of the material and from the interfaces on either side of the material. As a result, the thermal resistance across the material creates an additional temperature rise between the heatsink and the semiconductor die. The foregoing attached heatsinks are generally formed to maximize heat transfer, and the structural design assumes uniform heat flux from the die. In some structures, heat sinks and thermal interface materials are mounted to the base of the semiconductor, on the opposing side of the circuitry.

Turning now to an overview of the aspects of the disclosure, one or more embodiments of the disclosure address the above-described shortcomings by forming and bonding metal filaments directly to the surface of an electronic substrate to fabricate a heat sink. In some embodiments, the electronic substrate is the back side of a flip mounted die, such as an MMIC. Various metal filament bonding processes, e.g., ball bonding, wedge bonding, ribbon bonding, and/or chain bonding, are used to form metal filaments, e.g., wires and/or ribbons, to create highly tailored cooling heat sink structures directly on any surface of a semiconductor substrate, which eliminates the need for a separate coupling thermal interface material. One or more metal filament bonding processes are used to create a plurality of metal filaments, which can be formed in any pattern or density. When the heat flux is higher, for example, with power amplifier field effect transistors (FETs), the pattern is dense. The density of the plurality of metal filaments forming the heat sink is tailored in some embodiments to partially counteract the impact of upstream heating where the flow is across several devices.

The heat sink formed from the metal filaments is not connected to or part of electronic circuitry or electronic networks and is strictly used to dissipate heat. The heat sink is formed on the same side of the semiconductor substrate as the electronic circuitry in some embodiments. In other embodiments, the heat sink is formed on the opposing side of the semiconductor substrate as the electronic circuitry. The heat sink formed on the same side as the electronic circuitry provides an advantage for some electronics, such as a MMIC which is typically cooled from the opposing bottom surface.

Figure 1B:
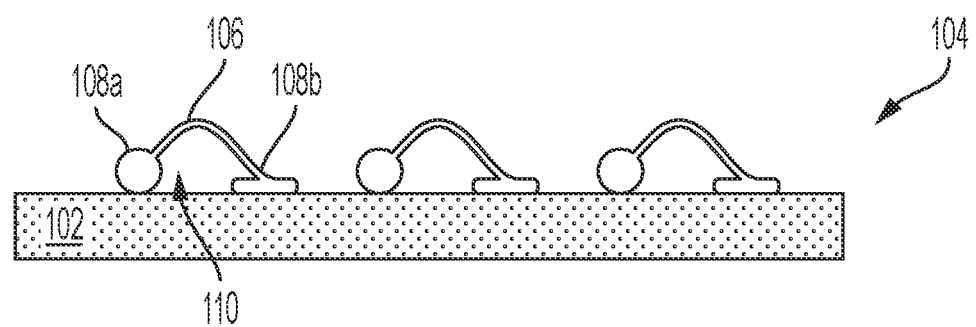
FIG. 1B is a side view of the heat sink of the electronic device of FIG. 1 according to embodiments of the present disclosure.

FIGS. 1A and 1B are a top view and side view, respectively, of an electronic device 100 with a heat sink 104 according to embodiments of the present disclosure. The electronic device 100 includes a semiconductor substrate 102. The semiconductor substrate 102 includes one or more semiconductor materials. In some embodiments, the semiconductor substrate 102 is the back side of a flip chip interconnect semiconductor device. The flip chip is a monolithic microwave integrated circuit (MMIC) according to embodiments. In other embodiments, the semiconductor substrate 102 is a processor interconnect. Yet, in some embodiments, the semiconductor substrate 102 is an application-specific integrated circuit (ASIC). In some embodiments, MMICs are formed from gallium arsenide or gallium nitride on silicon, and the bonded heatsinks are on the opposite side of the die from the active semiconductor. Yet, in other embodiments, the semiconductor substrate 102 is silicon, silicon germanium, or a combination thereof.

The heat sink 104 is formed by one or more filament bonding processes on the surface of the semiconductor substrate 102 to form a plurality of metal filaments. As further described below, the metal filament bonding process includes one or more processes, including but not limited to, ball bonding, wedge bonding, ribbon bonding, and/or chain bonding.

Figure 3:
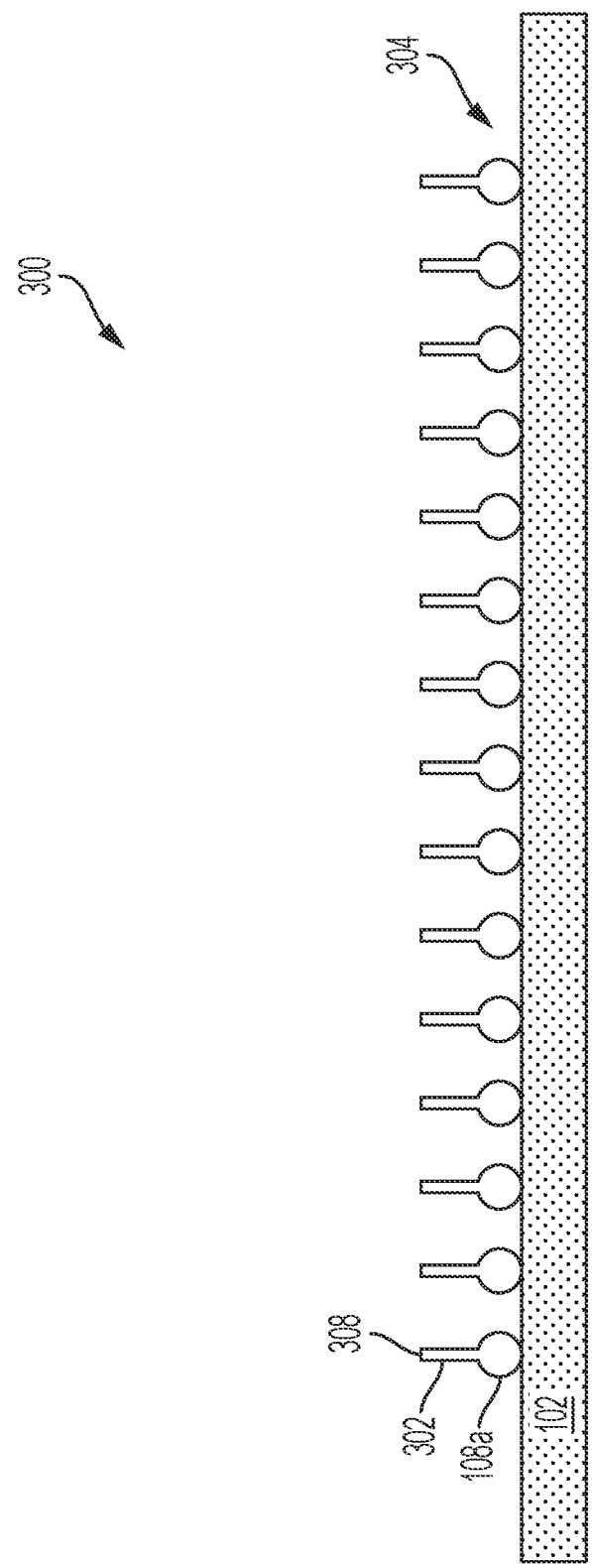
FIG. 3 is a side view of a heat sink of with tails formed on an electronic device according to embodiments of the present disclosure.

In FIGS. 1A and 1B, ball bonding is used to form the plurality of looped metal filaments forming the heat sink 104. The heat sink 104 includes a plurality of looped individual metal filaments 106, with at least one end that is connected to, joined to, or coupled to the surface of the semiconductor substrate 102. In the embodiments shown in FIGS. 1A and 1B, both ends (first end 108a and second end 108b) are connected to, joined to, or coupled to the surface of the semiconductor substrate 102. In other embodiments, only the first end 108a or the second end 108b are joined to the surface of the semiconductor substrate, for example, as shown in FIG. 3, discussed in further detail below.

Between the first end 108a and the second end 108b, the metal filaments 106 (or metal filament bodies) are raised in a loop body with respect to the surface of the semiconductor substrate 102, which forms a space 110 (also referred to as a gap), as shown in the side view in FIG. 1B, where the metal filaments 106 are surrounded by a coolant medium, e.g., air, to dissipate heat. The individual metal filaments 106 are formed with any angle with respect to the surface of the semiconductor substrate 102. The density of the individual metal filaments 106 also can be increased or decreased The heat sink 104 includes a metal conductor material. According to some embodiments, the metal conductor is gold, silver, aluminum, copper, or a combination thereof. In some embodiments, the metal conductor is gold. The individual metal filaments 106 of the heat sink 104 are round wires in some embodiments. In other embodiments, the individual metal filaments 106 of the heat sink 104 are non-round, for example, flat structures more commonly described as ribbons.

The diameters and dimensions of the metal filaments vary depending on the materials used. In some embodiments, the metal filaments 106 of the heat sink 104 have a diameter of about 1 to about 3 mils. In other embodiments, the individual metal filaments of the heat sink 104 have a diameter of about 0.4 mils to about 20 mils. In embodiments, one or more ends of the metal filaments (first end 108a and/or second end 208b) have a diameter that is greater than a diameter of the individual metal filament 106 or filament body. In one or more embodiments, the metal filaments 106 are ribbons and have dimensions of about 1-100 mils wide and about 0.25-3 mils thick. In one or more embodiments, the metal filaments 106 are wires and have a diameter of 0.7 mils to 20 mils, or 0.05 mils to 4 mils.

Figure 2:
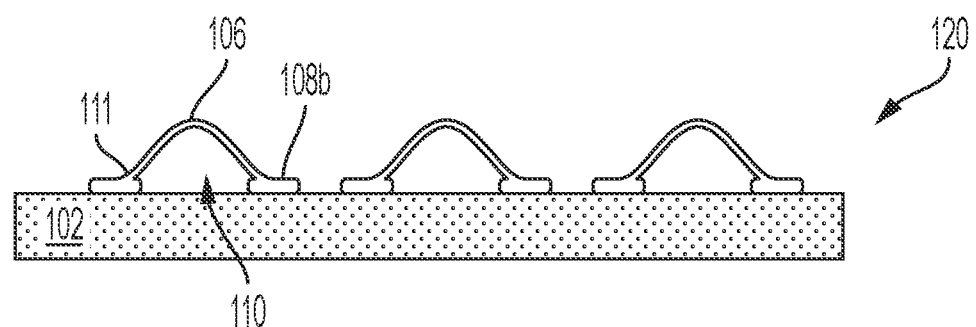
FIG. 2 is a side view of a heat sink with connected loops formed by wedge or ribbon bonding on an electronic device according to embodiments of the present disclosure.

FIG. 2 is a side view of a heat sink 120 formed by wedge bonding or ribbon bonding. A plurality of looped metal filaments form the heat sink 120 according to embodiments of the present disclosure. The heat sink 120 includes a plurality of metal filaments 106. Wedge bonding or ribbon bonding is used to form the plurality of looped metal filaments with one end (first end 111) connected to, joined to, or coupled to the surface of the semiconductor substrate 102. The second end 108b is also joined to the surface of the semiconductor substrate 102.

Between the first end 111 and the second end 108b, the metal filaments 106 (or metal filament bodies) are raised in a loop with respect to the surface of the semiconductor substrate 102, which forms a space 110 (also referred to as a gap) where the metal filaments 106 are surrounded by a coolant medium, e.g., air, to dissipate heat. The individual metal filaments 106 are formed with any angle with respect to the surface of the semiconductor substrate 102. The density of the individual metal filaments 106 also can be increased or decreased as needed.

FIG. 3 is a side view of a heat sink 304 of with metal filament tails formed on an electronic device 300 according to embodiments of the present disclosure. The heat sink 304 is formed by one or more filament bonding processes on the surface of the semiconductor substrate 102 to form a plurality of metal filaments 302. Ball bonding is used to form the plurality of non-looped metal filaments 302 with only one end (first end 108a) that is connected to, joined to, or coupled to the surface of the semiconductor substrate 102. The second end 308 is not joined to the surface of the semiconductor substrate 102 and forms a free fin or tail that extends away from the surface of the semiconductor substrate 102.

Between the first end 108a and the second end 308, the metal filaments 302 (or metal filament bodies) are surrounded by a coolant medium, e.g., air, to dissipate heat. Although shown as being perpendicular to the semiconductor substrate 102, the individual metal filaments 302 are formed with any angle with respect to the surface of the semiconductor substrate 102. The individual metal filaments 302 form oblique angles with respect to the surface of the semiconductor substrate 102 in embodiments. The density of the individual metal filaments 302 also can be increased or decreased as needed.

Figure 4:
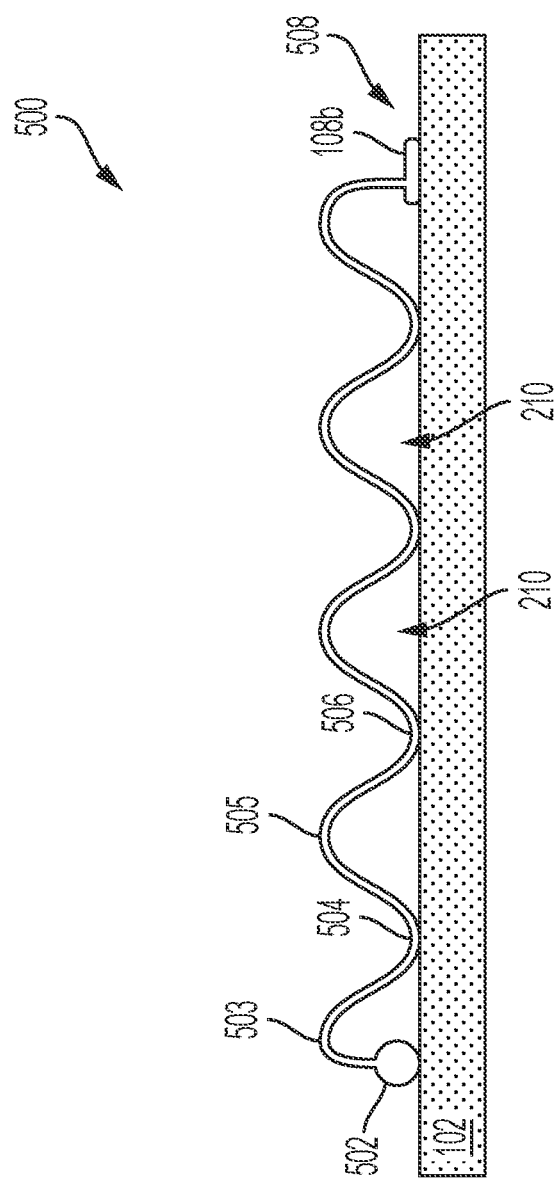
FIG. 4 is a side view of a heat sink formed by chain bonding on an electronic device according to embodiments of the present disclosure.

FIG. 4 is a side view of a heat sink 508 formed by chain bonding on a semiconductor substrate 102 an electronic device 500 according to embodiments of the present disclosure. In chain bonding with a ball bonder or wedge bonder or ribbon bonder, the first end 502 of the metal filament is joined to the surface of the semiconductor substrate 102, forming the first bond, a first loop 503 is created, a second bond 504 is formed to the semiconductor substrate 102, a second loop 505 is made, and a third bond 506 is formed to the semiconductor substrate 102. The process continues iteratively until the filament is broken and the deposition head moves away. In the resulting chain bond, there are not any breaks in the metal filament within the series of loops. The heat sink 508 includes one or more or a plurality of single metal filaments that are joined to semiconductor substrate 102 at three or more locations. The single metal filament is looped on the surface of the semiconductor substrate 102. Between loops, the metal filament raised with respect to the surface of the semiconductor substrate 102, which forms a plurality of spaces 210 (also referred to as gaps) where the metal filaments are surrounded by a coolant medium, such as air.

The processes used to form the heat sinks described above include metal filament bonding processes, including wire bonding, wedge bonding, ribbon bonding, and/or chain bonding. Such filament bonding processes are generally used to create electrical interconnections between semiconductors (or other integrated circuits) and silicon chips using bonding wires or ribbons. The metal filament bonding processes include melting the end of a metal filament. In ball bonding, melting the end of the metal filament forms a metal ball that is placed into contact with the bond pad. Pressure, heat, and ultrasonic forces are applied to it for a certain amount of time, which forms a metallurgical weld between the ball and the bond pad while also allowing deformation of the ball bond into its ending shape. Any one or more of the above described metal filaments can be combined to form a heat sink on a substrate.

Although such processes are generally used to create electrical connections, as described herein, filament bonding processes are used to form heat sinks from metal filaments which form no part of an electrical network or circuitry. According to embodiments of the present disclosure, a method for making a heat sink on an electronic device includes heating an end of a metal filament, and placing the heated filament end into contact with a surface of a semiconductor substrate to weld the metal filament to the surface of the semiconductor substrate. The method further includes extending the metal filament from or over the surface of the semiconductor substrate, and optionally, welding the second end of the metal filament to join the second end of the metal filament to the surface. The process is repeated to form a plurality of individual filaments on the semiconductor substrate.

According to some embodiments, a method of making a heat sink on an electronic device includes heating a metal filament, joining a first end of the metal filament to a surface of a semiconductor substrate, and extending the metal wire away from or across the surface of the semiconductor substrate. The method optionally further includes joining a second end of the metal filament to the surface of the semiconductor substrate to form an individual metal filament of a heat sink and repeating the method to form a plurality of metal filaments that dissipate heat from the semiconductor substrate.

Various embodiments of the present disclosure are described herein with reference to the related drawings. Alternative embodiments can be devised without departing from the scope of this disclosure. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. An electronic device comprising:
   a semiconductor substrate; and
   a heat sink connected directly to a surface of the semiconductor substrate, the heat sink comprising a metal filament that includes a first end joined to the surface, and a second end joined to the surface, wherein the first end and the second end of each metal filament has a diameter that is greater than a diameter of the body;
   wherein the heat sink is not part of an electrical network.

2. The electronic device of claim 1, wherein the electronic device is a flip chip device.

3. The electronic device of claim 1, wherein each metal filament of the plurality of metal filaments is gold, silver, aluminum, copper, or a combination thereof.

4. The electronic device of claim 1, wherein each body of the plurality of metal filaments is a round wire.

5. The electronic device of claim 1, wherein each body of the plurality of metal filaments is a round wire.

6. The electronic device of claim 1, wherein each body of the plurality of metal filaments has a diameter of about 1 mil to about 3 mils.

* * * * *